(12) United States Patent
Rankin et al.

(10) Patent No.: US 7,087,499 B2
(45) Date of Patent: Aug. 8, 2006

(54) INTEGRATED ANTIFUSE STRUCTURE FOR FINFET AND CMOS DEVICES

(75) Inventors: Jed H. Rankin, Richmond, VT (US); Wagdi W. Abadeer, Jericho, VT (US); Jeffrey S. Brown, Middlesex, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/539,333

(22) PCT Filed: Dec. 20, 2002

(86) PCT No.: PCT/US02/41182

§ 371 (c)(1), (2), (4) Date: Jun. 15, 2005

(87) PCT Pub. No.: WO2004/059726

PCT Pub. Date: Jul. 15, 2004

(65) Prior Publication Data

US 2006/0128071 A1    Jun. 15, 2006

(51) Int. Cl.
*H01L 21/76* (2006.01)
(52) U.S. Cl. .............................. 438/412; 257/E21.176; 257/E21.205; 257/E21.283
(58) Field of Classification Search ................ 438/412, 438/431; 257/E21.176, E21.205, E21.283
See application file for complete search history.

(56) References Cited

U.S. PATENT DOCUMENTS

| 5,557,136 | A | 9/1996 | Gordon et al. |
| 5,572,062 | A | 11/1996 | Iranmanesh |
| 5,915,171 | A | 6/1999 | Sheu |
| 6,130,469 | A | 10/2000 | Bracchitta et al. |
| 6,413,802 | B1* | 7/2002 | Hu et al. ..................... 438/151 |
| 6,642,090 | B1* | 11/2003 | Fried et al. ................. 438/164 |
| 6,657,259 | B1* | 12/2003 | Fried et al. ................. 257/350 |
| 2002/0036290 | A1* | 3/2002 | Inaba et al. .................... 257/66 |

* cited by examiner

*Primary Examiner*—W. David Coleman
(74) *Attorney, Agent, or Firm*—H. Daniel Schnurmann

(57) ABSTRACT

A method is described for fabricating and antifuse structure (100) integrated with a semiconductor device such as a FINFET or planar CMOS devise. A region of semiconducting material (11) is provided overlying an insulator (3) disposed on a substrate (10); an etching process exposes a plurality of corners (111–114) in the semiconducting material. The exposed corners are oxidized to form elongated tips (111*t*–114*t*) at the corners; the oxide (31) overlying the tips is removed. An oxide layer (51), such as a gate oxide, is then formed on the semiconducting material and overlying the corners; this layer has a reduced thickness at the corners. A layer of conducting material (60) is formed in contact with the oxide layer (51) at the corners, thereby forming a plurality of possible breakdown paths between the semiconducting material and the layer of conducting material through the oxide layer. Applying a voltage, such as a burn-in voltage, to the structure converts at least one of the breakdown paths to a conducting path (103, 280).

17 Claims, 10 Drawing Sheets

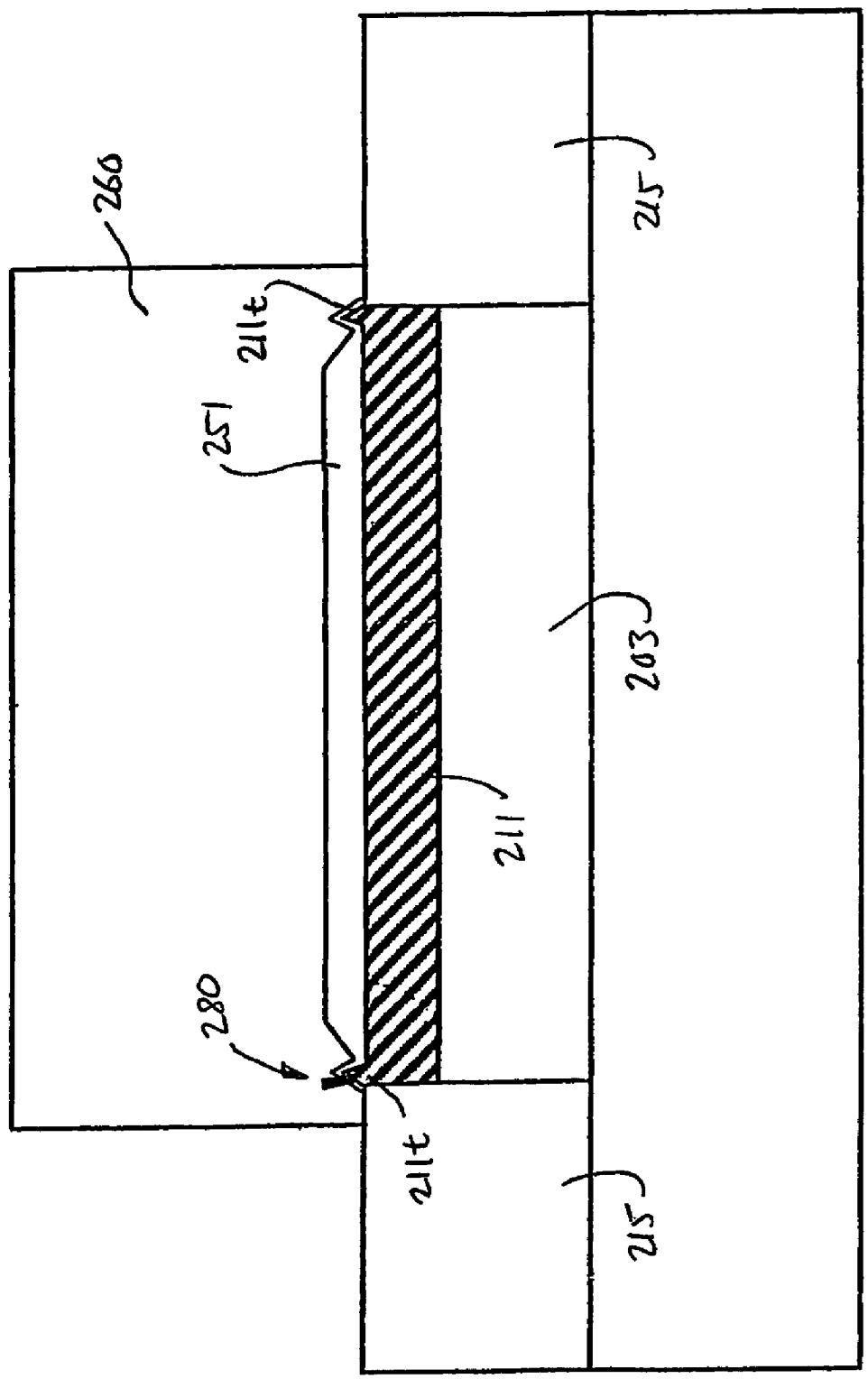

US 7,087,499 B2

INTEGRATED ANTIFUSE STRUCTURE FOR FINFET AND CMOS DEVICES

FIELD OF THE INVENTION

This invention relates to the manufacture of very large-scale integrated devices, particularly FINFET and planar CMOS devices, with electrical antifuses integrated therein.

BACKGROUND OF THE INVENTION

In their ongoing effort to obtain smaller, faster and more efficient semiconductor devices, designers and engineers have attempted to reduce the scale of all the dimensions and features of the devices. In the design and manufacture of field-effect transistors (FETs) particularly, it has been found that two features are difficult to scale down: the device current (which is related to the size of the FET gate) and the size of fuse structures.

To address device scaling limitations in gate design, considerable work has recently been done to develop manufacturable methods to create novel types of gates. One example of a "dual gate" or "wrap-around gate" design is the FINFET device, where the gate oxide is grown on the face of a vertical fin of silicon and the gate is on both sides of the silicon feature, which when activated fully depletes the silicon. FIG. 1A shows two such fin structures 1, 2 formed on a silicon-on-insulator (SOI) substrate, where the top of the bulk silicon substrate 10 has a buried oxide (BOX) layer 3 formed thereon, and the devices are made in a further silicon layer overlying the BOX. Silicon fins 11, 21 are shown after being formed by etching of this silicon layer down to the BOX surface, using an etching hardmask 12, 22 for image transfer. A gate oxide may then be grown on both faces of a silicon fin (such as faces 11a and 11b of fin 11). The FINFET technology shows promise in offering higher areal gate density than more conventional planar CMOS devices, as well as better device performance, and lower power consumption.

It is also desirable to incorporate the manufacture of fuses and antifuses into existing processes for creating the various FET structures. As is known in the art, fuses are conductors which may easily be removed ("blown") to create open circuits, while antifuses are areas of dielectric which may be electrically broken down to form a permanent conducting path. As the density of devices on a chip increases, the number of fuses and antifuses increases in order to provide specific addressing of each individual circuit. Fuses and antifuses are preferably formed with minimal expense of chip area and require no additional lithographic steps. Recent scaling of fuses has not kept up with the scaling rate of the rest of the silicon features, so that chip regions devoted to fuses are occupying a larger percentage of the total chip area.

If devices are formed with shallow-trench isolation (STI), etching of the isolation trench may create sharp corners in the silicon where the sidewall of the trench meets the top silicon surface or the trench bottom. If these corners are not rounded by further processing, a dielectric layer overlying the corners may be thinned and present reliability problems (see U.S. Pat. No. 6,150,234). Similarly, etching of a contact hole through a dielectric layer may result in a trench with sharp corners. On the other hand, a sharp trench corner presents an opportunity to conveniently form antifuses (the trench being etched in a conductive material or being coated with a conductive material), since the electric field is generally enhanced at the corner; while an insulating layer overlying the corner is thinned (see U.S. Pat. No. 5,502,000; U.S. Pat. No. 5,322,812; U.S. Pat. No. 6,096,580 and references cited therein; and Chen et al., IEEE Electron Device Letters 13, 53 (1992)).

Because significantly less chip area is required, it is preferable to fabricate electrical fuses rather than mechanical fuses as part of the transistor fabrication process. Conventional fuses are "blown" via laser ablation or other mechanical means to create an electrical open. Electrical fuses or antifuses are "blown" via internal electrical wiring in the chip; the area requirement for electrical fuses/antifuses is therefore much less. In addition, mechanical fuses require a protection region around and below them, to prevent the fuse-blowing technique from having other detrimental impacts on the chip circuits. Electrical fuses and antifuses do not have this requirement. To save chip area and thus reduce manufacturing cost, it therefore is desirable to fabricate electrical fuses or antifuses which may be integrated with fabrication of FINFET and planar CMOS devices, with a minimum number of additional fabrication steps.

SUMMARY OF THE INVENTION

The present invention addresses the above-described need by providing a method for fabricating an antifuse structure integrated with a semiconductor device, with a minimum of additional process steps. A region of semiconducting material is provided overlying an insulator disposed on a substrate; an etching process exposes a plurality of corners in the semiconducting material. The exposed corners are oxidized to form elongated tips at the corners; the oxide overlying the tips is removed. An oxide layer, such as a gate oxide, is then formed on the semiconducting material and overlying the corners; this layer has a reduced thickness at the corners. A layer of conducting material is formed in contact with the oxide layer at the corners, thereby forming a plurality of possible breakdown paths between the semiconducting material and the layer of conducting material through the oxide layer. Applying a voltage, such as a burn-in voltage, to the structure converts at least one of the breakdown paths to a conducting path, when it is desired to activate a specific antifuse electrically.

This process may be practiced with FINFET or planar CMOS devices, so that the antifuse structures are integrated with those devices.

It is noteworthy that the antifuse structures fabricated with this process each have a plurality of possible breakdown paths which are electrically in parallel. A conducting path may be formed by breaking down the oxide layer at any of these paths. This redundancy helps to ensure that the device will be programmable. The applied voltage is typically about 1.5 times the nominal voltage for the device.

Furthermore, in accordance with the present invention, an antifuse structure is provided which is integrated with a semiconductor device. The antifuse structure includes a region of semiconducting material overlying an insulator disposed on a substrate; the semiconducting material has a plurality of corners with a plurality of elongated tips of the semiconducting material at the respective corners. An oxide layer is disposed on the semiconducting material and overlying the corners; the oxide layer has a nominal thickness and a reduced thickness at the corners less than the nominal thickness. The structure also includes a layer of conducting material in contact with the oxide layer at the corners. A feature of the structure is that a plurality of possible breakdown paths are disposed at the corners, between the semiconducting material and the layer of conducting material through the reduced thickness of the oxide layer.

It is also noteworthy that the antifuse structures are integrated at the silicon level, and accordingly require minimal chip area. The fabrication process for the antifuses requires only one additional masking layer, relative to the standard transistor fabrication processes.

BRIEF DESCRIPTION OF DRAWINGS

FIGS. 2A–2E are schematic illustrations of steps in a fabrication process for integrated antifuses in a planar CMOS device, in accordance with a second embodiment of the invention.

DETAILED DESCRIPTION OF PREFERRED EMBODIMENTS OF THE INVENTION.

In accordance with the present invention, a plurality of antifuses is formed at a semiconducting gate structure by oxidation of exposed corners. This process may be applied to either FINFET or planar CMOS gate structures, as detailed below.

(1) Antifuses for FINFET Devices

Figure 1A:
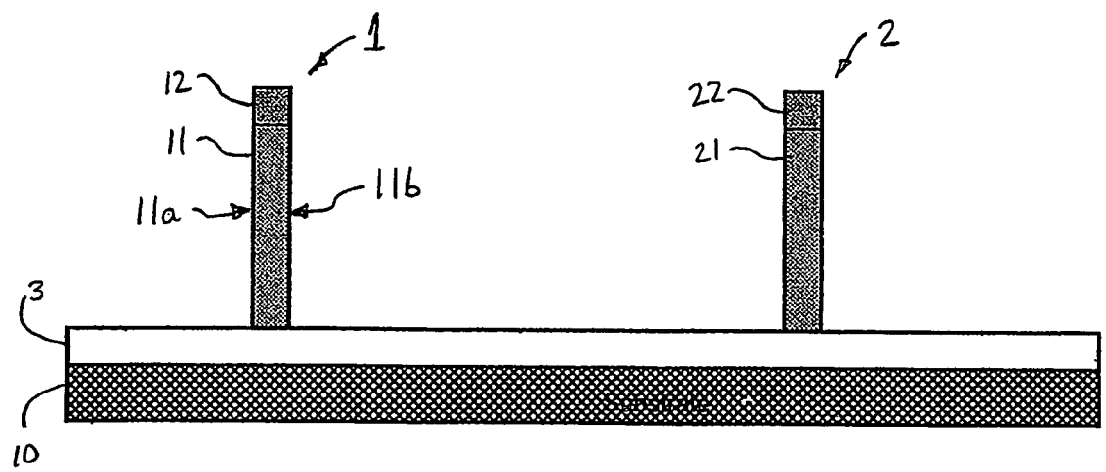
FIGS. 1A–1G are schematic illustrations of steps in a fabrication process for integrated antifuses in a FINFET device, in accordance with a first embodiment of the invention.
Figure 1B:
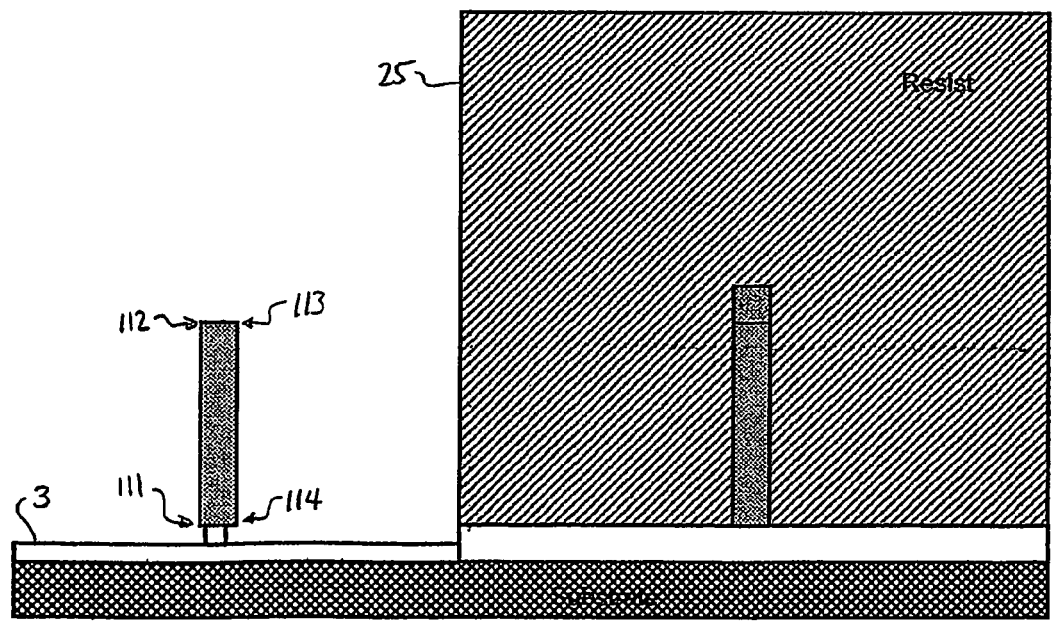

FIG. 1A shows two neighboring silicon fins 11, 21 which may form the bodies of FINFETs after gate electrode processing. In this illustration, one of these (fin 11) is instead made into an antifuse structure. The fin structure 2, which includes fin 21 and hardmask 22, is coated with a protective layer of resist 25; the resist is exposed and developed to uncover fin structure 1. The exposed portion of the BOX layer 3 is then subjected to an isotropic etch which undercuts silicon fin 11 (see FIG. 1B). The hardmask 12 is also removed in this step. It should be noted that the etching and undercutting results in four exposed corners 111–114 on silicon fin 11.

Figure 1C:
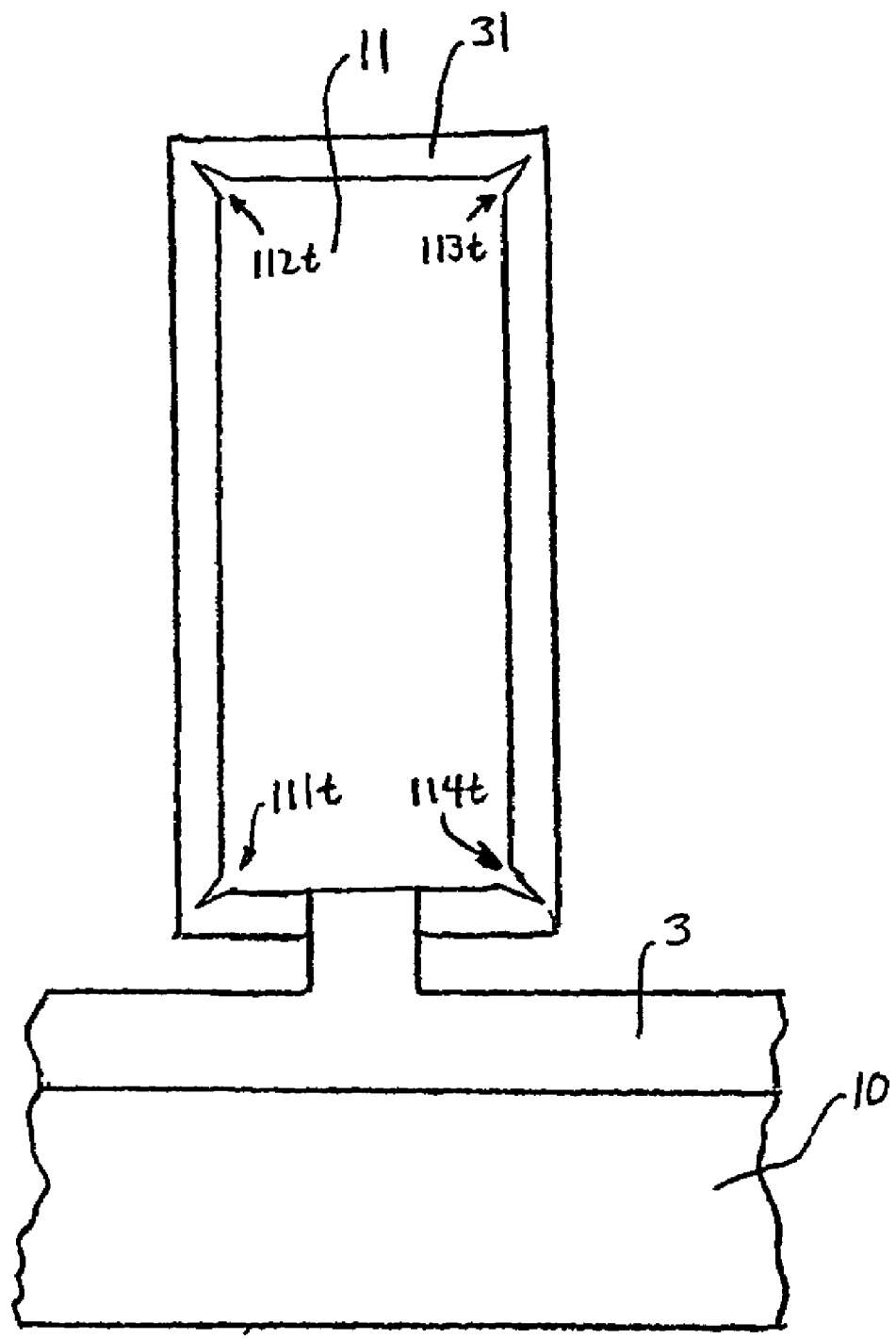
Figure 1D:
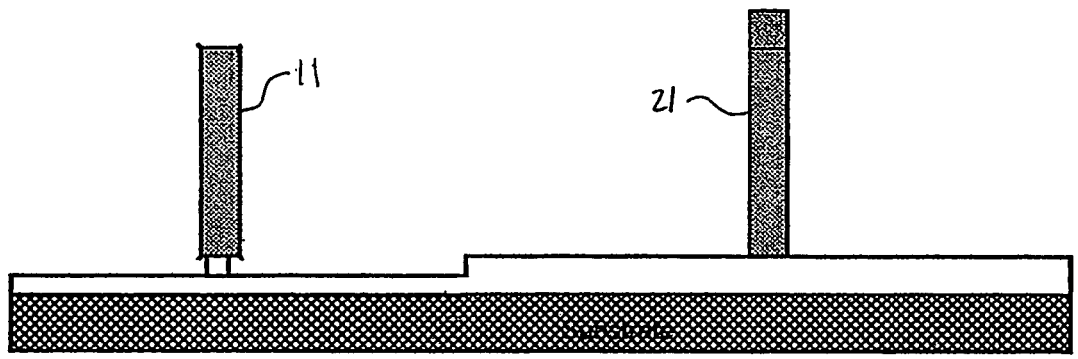

The silicon surface of fin 11 is then oxidized in a low-temperature oxidation process, to form an oxide layer 31 thereon. The oxidation process is preferably a dry/wet/dry process at 900° C., which is known to those skilled in the art. During the oxidation process, two-dimensional stresses at the corners 111–114 result in formation of elongated tips of silicon 111t, 112t, 113t, 114t, shown on an exaggerated scale in FIG. 1C. These tips are created during oxidation as the stress in the oxide film at the corners reduces the oxygen diffusion rate. Oxide layer 31 is then removed in an isotropic etch process, after which resist 25 is stripped (see FIG. 1D).

An n+ ion implantation may be advantageously performed into the fuse region before resist 25 is removed. Although not required for operability of the structure as an antifuse, this implantation process makes the silicon portion of the fuse an improved conductor, and improves the performance of the fin in terms of required programming voltage and reliability.

Figure 1E:
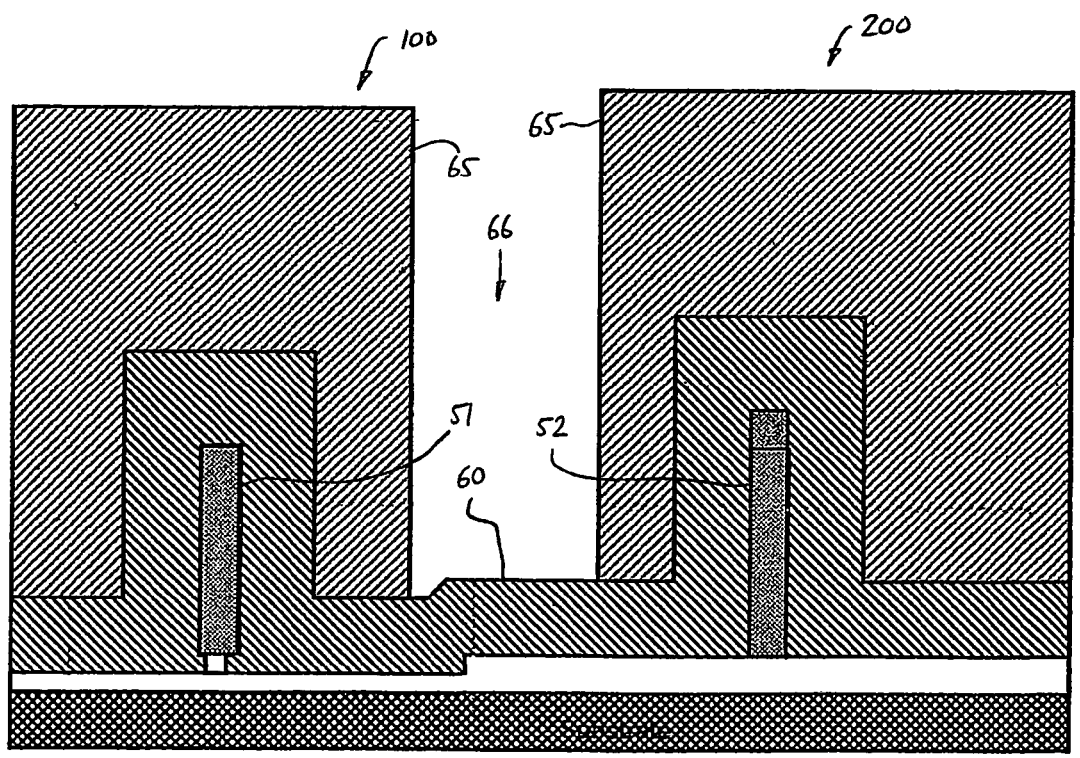
Figure 1F:
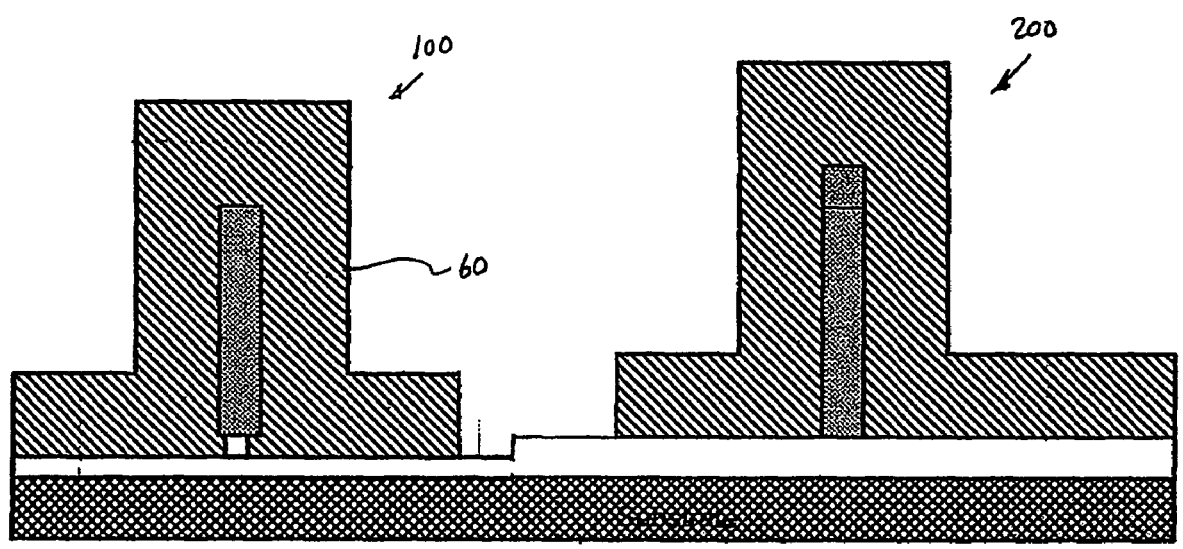

A standard gate oxide preclean is then performed on both silicon fins 11 and 21, after which a gate oxide 51, 52 is grown on the exposed surfaces of fins 11 and 21 respectively. The thickness of the gate oxide is typically in the range 15–40 Å. A polysilicon conductor layer 60 is then deposited over the fins; this polysilicon layer serves as the gate conductor for the FINFET 200, while providing a conducting path in the antifuse 100. A resist layer 65 is deposited over both structures and patterned to define the transistor gates, as well as one node of the fuse. As shown in FIG. 1E, opening 66 separates the two types of structures. The portion of polysilicon layer 60 exposed in this opening is then etched, and resist 65 is stripped away. The FINFET structure 200 and the antifuse structure 100 are thus electrically isolated from each other (see FIG. 1F).

Figure 1G:
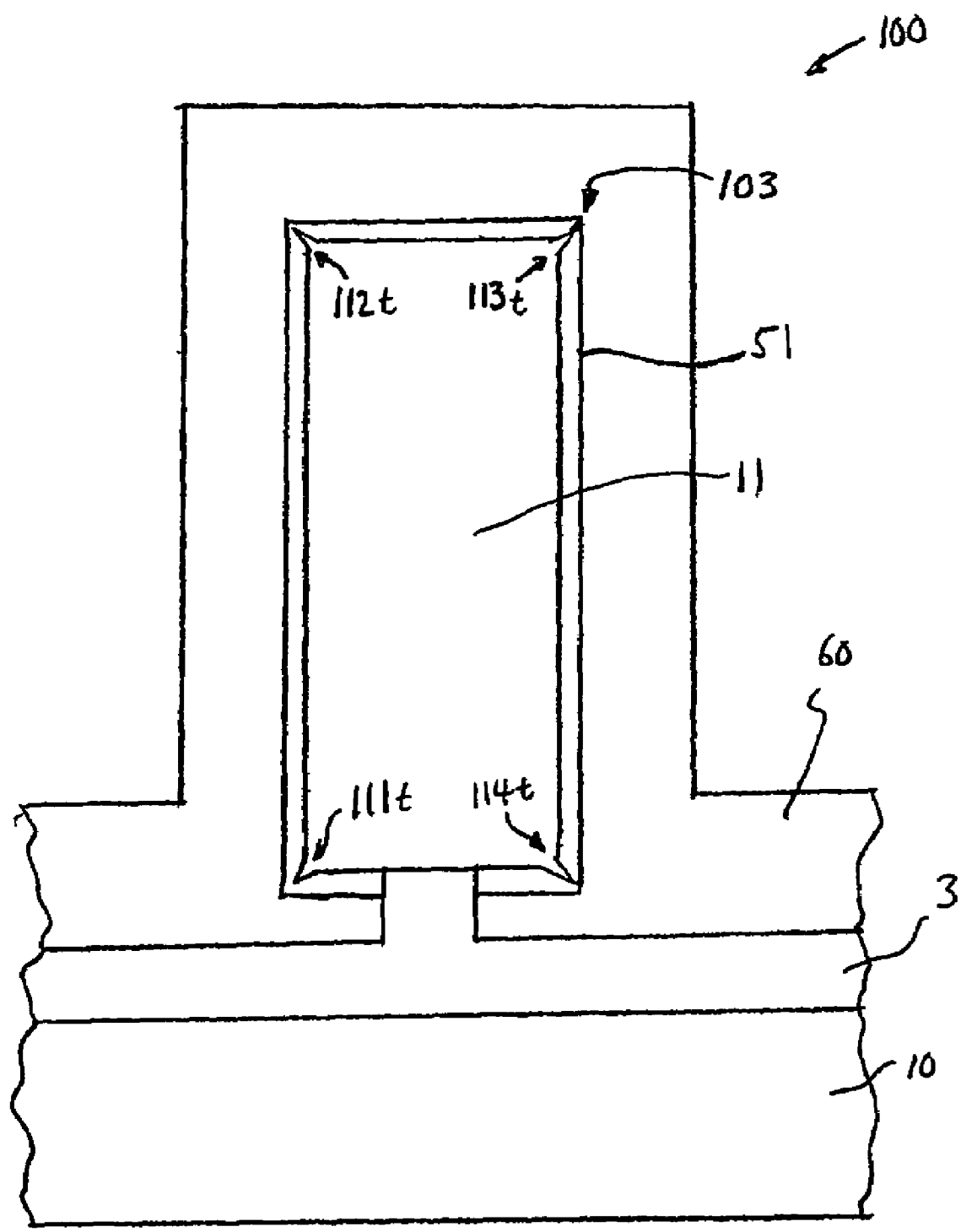

FIG. 1G is a detail view showing the gate oxide 51 overlying the corners of fin 11 having tips 111t, 112t, 113t, 114t, with a reduced thickness at the corners (tips) relative to the nominal thickness thereof. The tips at the corners are shown in an exaggerated fashion for the purposes of illustration; actual thinning of the oxide is approximately 15%–30% as compared with the oxide covering the central area on the face of the fin. The tips in FIG. 1G are shown only in cross-section; it should be understood that an elongated tip is formed along the edge of the fin, so that sharp ridges run the length of the fin, normal to the plane of the figure. It should be noted that in FIG. 1G there are four possible breakdown paths across the thinned oxide, so that there is built-in redundancy in the antifuse design. All of these breakdown paths are electrically in parallel, so that an actual breakdown of any one of them is sufficient to convert the antifuse into an electrical short, which can be used to reroute data or instructions in the chip. A programming or writing operation for the antifuse (that is, converting the antifuse into a conducting path) thus comprises applying a voltage sufficient to cause breakdown at one of the corners (such as corner 113 in FIG. 1G, creating breakdown path 103). It has been found that the writing operation can be performed effectively using the burn-in voltage for the FET devices, which is typically 1.5 times the nominal voltage. For example, with a nominal voltage of about 1.2 V, the burn-in voltage would be about 1.8 V. Accordingly, a writing operation on the antifuse may be performed at burn-in voltages without adversely affecting the normal operation of the other devices on the chip.

(2) Antifuses for Planar CMOS Devices

Figure 2A:
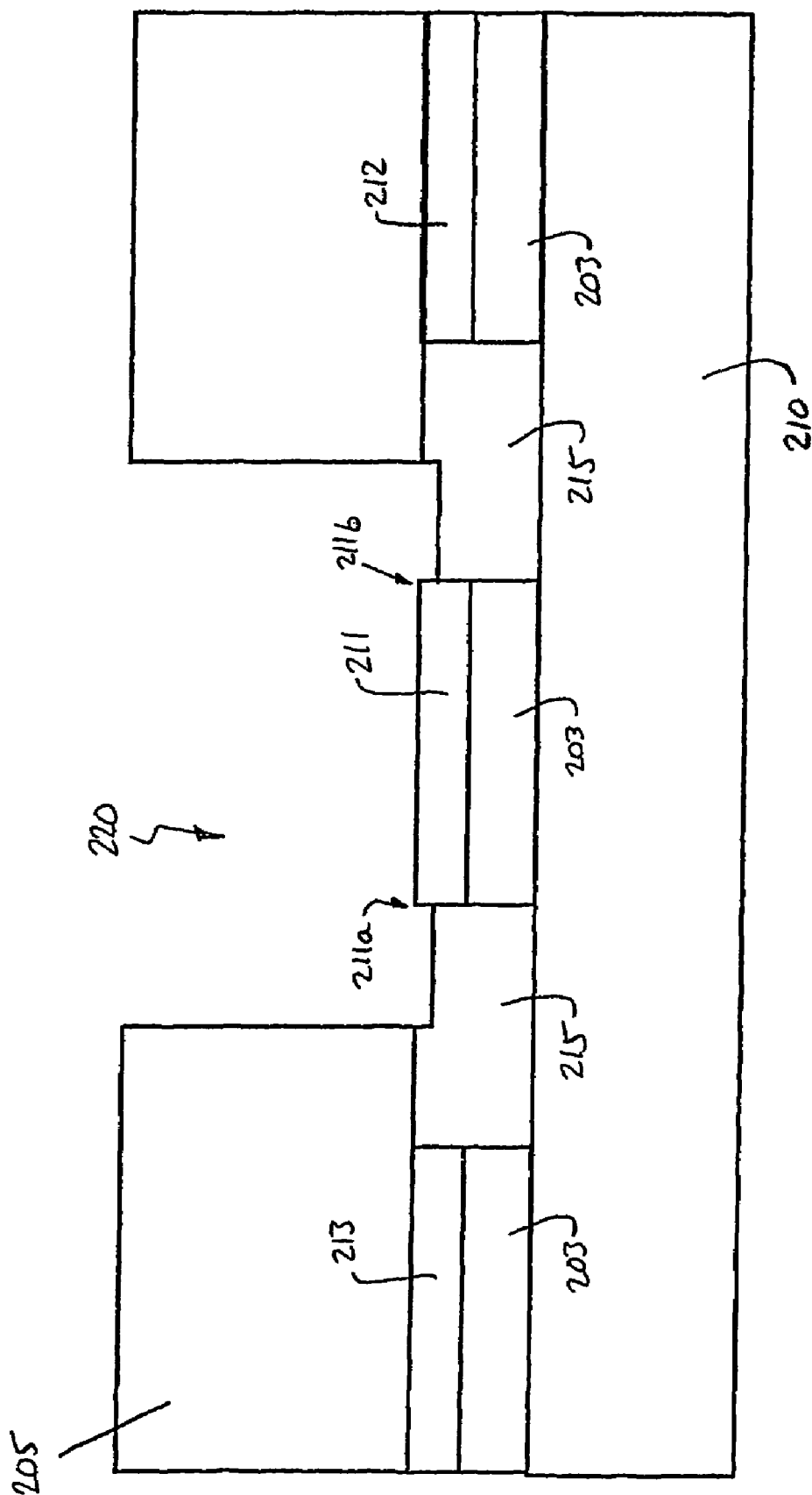

The essential features of the above-described method may be adapted to planar CMOS devices fabricated on SOI substrates. FIG. 2A shows three silicon gate regions 211, 212, 213, where region 211 is to be made into an antifuse instead of a FET. The silicon regions are disposed on a buried oxide (BOX) 203 on substrate 210, and are separated by shallow trench isolation regions (STI) 215. A resist layer 205 is deposited over all the silicon regions, and then patterned so that an opening 220 in the resist exposes silicon region 211 and portions of isolation regions 215 which are to be fabricated into an antifuse. The STI material 215 (typically oxide) is then etched, in order to expose corners 211a, 211b of silicon region 211.

Figure 2B:
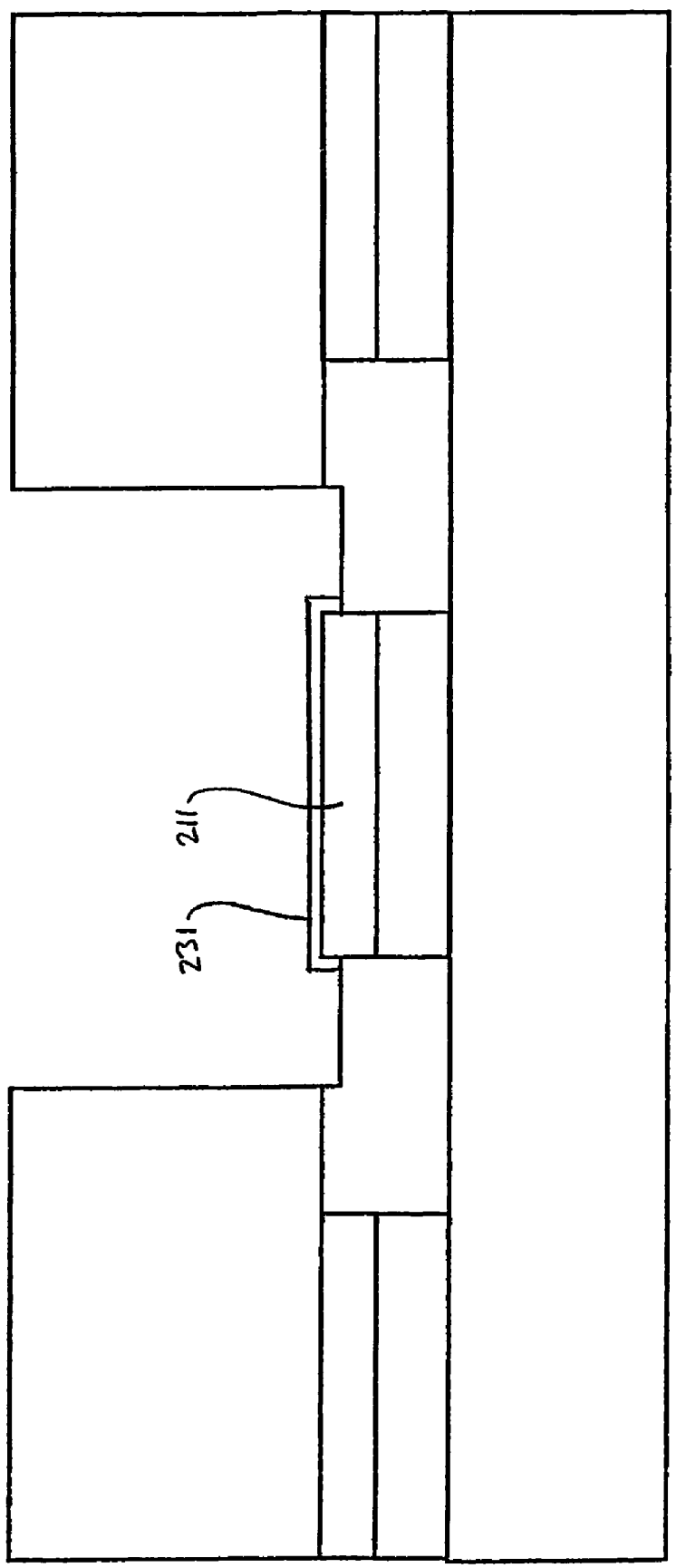
Figure 2C:
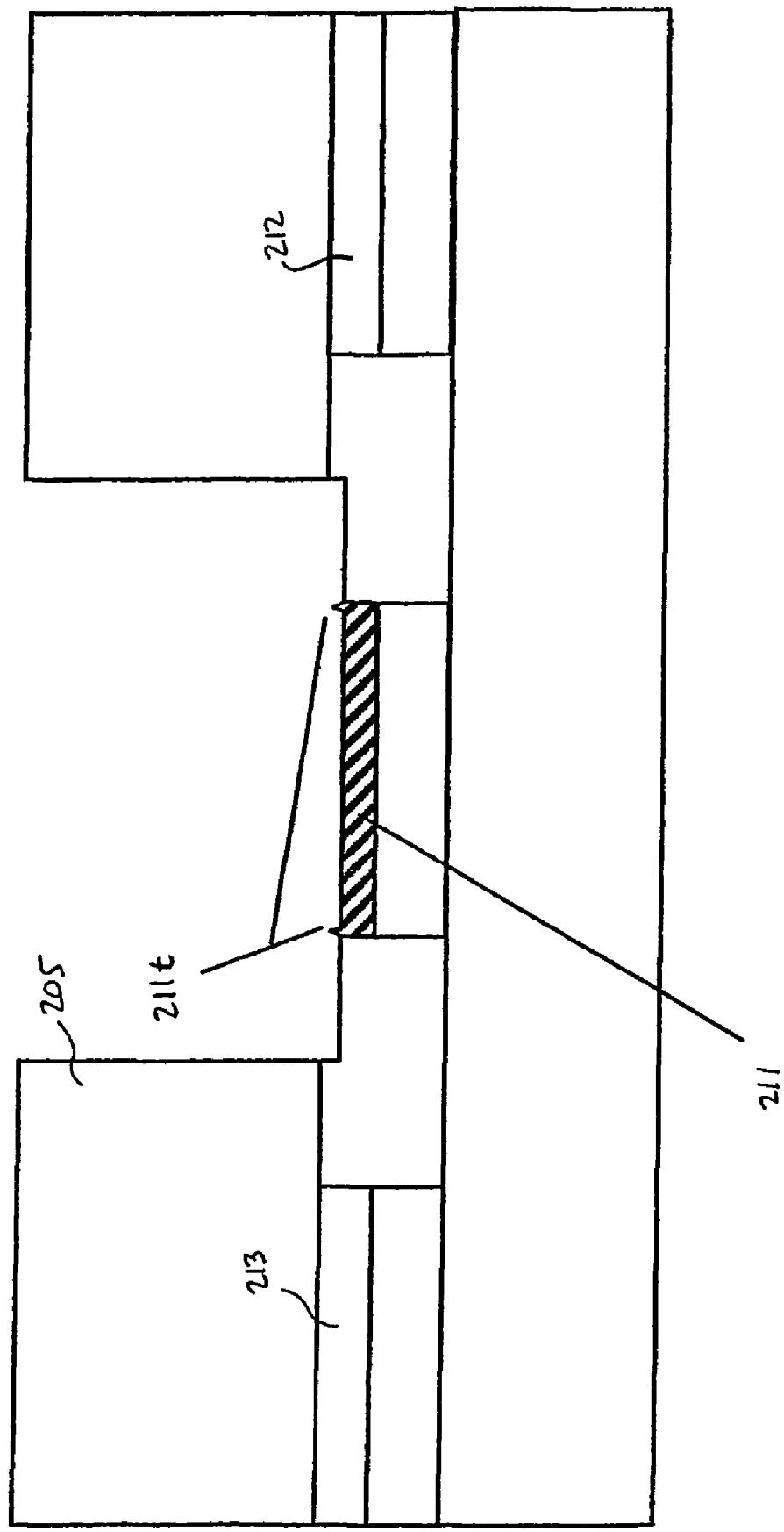

A low-temperature oxidation process is then performed so that the exposed silicon surface is covered by an oxide layer 231, as shown in FIG. 2B. This oxidation process causes formation of silicon tips 211t at the corners, as shown in FIG. 2C. As noted above, the tips are shown only in cross section; sharp ridges run the length of region 211 normal to the plane of the figure. The oxide layer 231 is then removed using an isotropic etch process. At this point it is preferred, but not required, that silicon region 211 (which will become the antifuse) be implanted with an n+ dopant, in order to facilitate programming (writing) of the antifuse. Resist 205 is then removed.

Figure 2D:
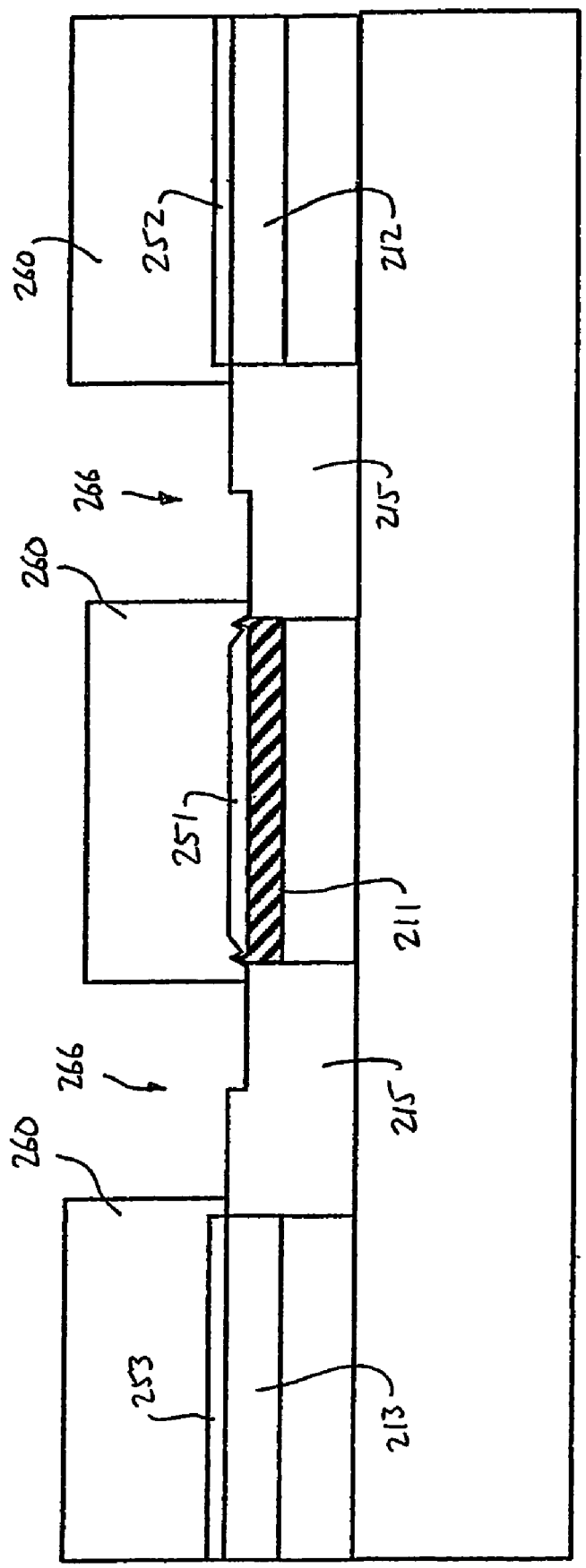

A standard preclean is then performed and a gate oxide 251, 252, 253 is grown on the surface of silicon regions 211, 212, 213 respectively (see FIG. 2D). This gate oxide is typically 10–20 Å thick. A polysilicon layer 260 is deposited on all the silicon and isolation regions. This layer is then patterned with the transistor gate images, as well as defining one node of the antifuse, and etched so that openings 266 are formed over the isolation regions 215, electrically isolating the MOS device regions from the antifuse and from each other.

FIG. 2E is a detail view of the antifuse structure for planar CMOS devices. The thinning of the gate oxide near the tips 211t is exaggerated for purposes of illustration; the gate oxide at this location is typically 15% to 30% thinner than at the central area of the antifuse (that is, layer 251 has a reduced thickness at the corners 15% to 30% less than the nominal thickness of 10–20 Å). Since at least two exposed corners of the silicon have been oxidized, there are at least two potential breakdown paths between the doped silicon region 211 and the polysilicon conductor 260. Programming (writing) the antifuse using a voltage as low as the burn-in voltage creates conducting path 280, shown schematically in FIG. 2E.

INDUSTRIAL APPLICABILITY

The present invention is generally applicable to the problem of fabricating field-programmable gate arrays which are often required for application-specific integrated circuits (ASICs). In addition, antifuses can be used to re-route data for redundancy, such as in memory circuits, or in advanced microprocessors. In particular, the invention is applicable to gate arrays or SRAMs employing FINFET or planar CMOS technology. An important advantage of the invention is that redundant breakdown points are provided at each antifuse location. In addition, the antifuse fabrication process requires only one additional masking layer relative to the standard transistor fabrication process. Furthermore, the antifuses are fabricated at the silicon level (that is, during the process of building the neighboring transistors), resulting in significant saving of area on the chip.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

The invention claimed is:

1. A method for fabricating an antifuse structure integrated with a semiconductor device, the method comprising the steps of:
   forming a region of semiconducting material overlying an insulator disposed on a substrate;
   performing an etching process to expose a plurality of corners in the semiconducting material;
   forming a plurality of elongated tips of the semiconducting material at the respective corners by oxidizing the exposed corners to form an oxide thereon and then removing the oxide;
   subsequently forming an oxide layer on the semiconducting material and overlying the corners, the oxide layer having a nominal thickness and a reduced thickness at the corners less than the nominal thickness; and
   forming a layer of conducting material in contact with the oxide layer at the corners,
   thereby forming a plurality of possible breakdown paths at said corners, between the semiconducting material and the layer of conducting material through the oxide layer.

2. A method according to claim 1, wherein the region of semiconducting material is a fin formed in a FINFET process.

3. A method according to claim 1, wherein the region of semiconducting material is a gate region formed in a planar CMOS process.

4. A method according to claim 2 or claim 3, further comprising the step of doping the region of semiconducting material.

5. A method according to claim 1, wherein oxidizing the exposed corners is performed in accordance with a low-temperature oxidation process.

6. A method according to claim 1, wherein the breakdown paths are electrically in parallel.

7. A method according to claim 1, further comprising the step of applying a voltage to the antifuse structure, thereby converting at least one of the breakdown paths to a conducting path through the oxide layer.

8. A method according to claim 7, wherein the voltage is applied in accordance with a burn-in process for the device.

9. A method according to claim 7, wherein the device has a nominal voltage, and the applied voltage is approximately 1.5 times the nominal voltage.

10. An antifuse structure integrated with a semiconductor device, the structure comprising:
    a region of semiconducting material overlying an insulator disposed on a substrate, the semiconducting material having a plurality of corners with a plurality of elongated tips of the semiconducting material at the respective corners;
    an oxide layer on the semiconducting material and overlying the corners and in contact with the corners, the oxide layer having a nominal thickness and a reduced thickness at the corners less than the nominal thickness; and
    a layer of conducting material in contact with the oxide layer at the corners,
    wherein
    a plurality of possible breakdown paths are disposed at said corners, between the semiconducting material and the layer of conducting material through the reduced thickness of the oxide layer, and
    the elongated tips are formed by oxidation of the exposed corners, the oxide formed thereby being different from the oxide layer.

11. An antifuse structure according to claim 10, wherein the region of semiconducting material is a fin formed in a FINFET process.

12. An antifuse structure according to claim 10, wherein the region of semiconducting material is a gate region formed in a planar CMOS process.

13. An antifuse structure according to claim 10, wherein the region of semiconducting material is a region of doped material.

14. An antifuse structure according to claim 10, wherein the breakdown paths are electrically in parallel.

15. An antifuse structure according to claim 10, wherein at least one of the breakdown paths is a conducting path through the oxide layer formed by application of a voltage thereto.

16. An antifuse structure according to claim 15, wherein the applied voltage is a burn-in voltage for the device.

17. A method according to claim 15, wherein the device has a nominal voltage, and the applied voltage is approximately 1.5 times the nominal voltage.

* * * * *

UNITED STATES PATENT AND TRADEMARK OFFICE
CERTIFICATE OF CORRECTION

PATENT NO. : 7,087,499 B2
APPLICATION NO. : 10/539333
DATED : August 8, 2006
INVENTOR(S) : Jed H. Rankin et al.

It is certified that error appears in the above-identified patent and that said Letters Patent is hereby corrected as shown below:

Please insert item [75], Kiran V. Chatty, Robert J. Gauthier Jr. and David M. Fried.

Signed and Sealed this

Twenty-sixth Day of December, 2006

JON W. DUDAS
*Director of the United States Patent and Trademark Office*